US010303196B1

(12) United States Patent
Jain et al.

(10) Patent No.: US 10,303,196 B1
(45) Date of Patent: May 28, 2019

(54) ON-CHIP VOLTAGE GENERATOR FOR BACK-BIASING FIELD EFFECT TRANSISTORS IN A CIRCUIT BLOCK

(71) Applicant: GLOBALFOUNDRIES INC., Grand Cayman (KY)

(72) Inventors: Navneet Jain, Milpitas, CA (US); Arif A. Siddiqi, Milpitas, CA (US); Mahbub Rashed, Cupertino, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/966,300

(22) Filed: Apr. 30, 2018

(51) Int. Cl.
| | | |
|---|---|---|
| G05F 3/20 | (2006.01) | |
| G11C 5/14 | (2006.01) | |
| H03K 19/00 | (2006.01) | |
| H01L 29/78 | (2006.01) | |
| H01L 29/06 | (2006.01) | |
| H01L 27/092 | (2006.01) | |

(52) U.S. Cl.
CPC ............. *G05F 3/205* (2013.01); *G11C 5/146* (2013.01); *H03K 19/0027* (2013.01); *H01L 27/092* (2013.01); *H01L 29/0649* (2013.01); *H01L 29/7838* (2013.01); *H03K 2217/0018* (2013.01)

(58) Field of Classification Search
CPC ..... G05F 3/205; G11C 5/146; H03K 19/0027; H03K 2217/0018
USPC ......................................... 327/534, 535, 537
See application file for complete search history.

(56) References Cited

U.S. PATENT DOCUMENTS

| | | | |
|---|---|---|---|
| 4,628,214 A | 12/1986 | Leuschner | |
| 5,546,044 A * | 8/1996 | Calligaro | G11C 5/145 327/535 |
| 7,236,045 B2 | 6/2007 | Tschanz et al. | |
| 2004/0155636 A1* | 8/2004 | Fukui | G05F 1/56 323/281 |
| 2007/0242497 A1 | 10/2007 | Joshi et al. | |
| 2013/0038382 A1* | 2/2013 | Meijer | G06F 1/3287 327/537 |
| 2018/0337663 A1* | 11/2018 | Kwon | G05F 1/575 |

OTHER PUBLICATIONS

"Introducing the 22FDX 22nm FD-SOI Platform," Globalfoundries, Mar. 2016, pp. 1-13.
Srinivasan et al., "Body-Bias Scaling for Globalfoundries 22FDx Technology New Dimension to Explore the Design," Globalfoundries, SNUG Silicon Valley, Mar. 2016, pp. 1-28.

\* cited by examiner

*Primary Examiner* — William Hernandez
(74) *Attorney, Agent, or Firm* — Gibb & Riley, LLC; David A. Cain, Esq.

(57) ABSTRACT

Disclosed is a voltage generator that includes a first voltage generation circuit and a second voltage generation circuit. The first voltage generation circuit is selectively operable in a single trimming mode enabling positive trimming only or in a dual trimming mode that shifts the voltage range downward enabling a somewhat smaller amount of positive trimming and also some negative trimming. The second voltage generation circuit is selectively operable in a single trimming mode enabling negative trimming only or in a dual trimming mode that shifts the voltage range upward enabling a somewhat smaller amount of negative trimming and also some positive trimming. Also disclosed is an integrated circuit (IC) chip that incorporates one or more such voltage generators for back-biasing the field effect transistors in one or more circuit blocks, respectively.

20 Claims, 7 Drawing Sheets

ON-CHIP VOLTAGE GENERATOR FOR BACK-BIASING FIELD EFFECT TRANSISTORS IN A CIRCUIT BLOCK

BACKGROUND

Field of the Invention

The present invention relates to voltage generators and, particularly, to an on-chip voltage generator for back-biasing N-type and P-type field effect transistors in a circuit block.

Description of Related Art

Back-biasing refers to a process wherein a voltage is applied to the back-side of the channel region of a field effect transistor opposite the gate in order to fine-tune the threshold voltage (Vt) of the FET. This process is also referred to in the art as trimming. Forward back-biasing (FBB) refers specifically to applying a voltage that will reduce the Vt of the FET, thereby increasing the switching speed. Generally, for a P-type field effect transistor (PFET), FBB is achieved by applying a negative voltage to the back-side of the channel region; whereas, for an N-type field effect transistor (NFET), FBB is achieved by applying a positive voltage to the back-side of the channel region. Reverse back-biasing (RBB) refers specifically to applying a voltage that will increase the Vt of the FET, thereby decreasing the switching speed and reducing leakage current. Generally, for a PFET, RBB is achieved by applying a positive voltage to the back-side of the channel region; whereas, for an NFET, RBB is achieved by applying a negative voltage to the back-side of the channel region.

A voltage generator (also referred to as a back-bias generator) configured to provide voltages suitable back-biasing the PFETs and NFETs in a given circuit block will typically have two different voltage generation circuits: one that outputs a positive voltage and one that outputs a negative voltage. Specifically, within a conventional back-bias generator one voltage generation circuit is configured to generate selectable voltages at multiple uniform digital-to-analog converter (DAC) steps from 0 volts to some positive voltage (e.g., to +1.8 volts) for positive voltage trimming to achieve a target threshold voltage and another voltage generation circuit is typically configured to generate selectable voltages at multiple uniform DAC steps from some negative voltage (e.g., from −1.8 volts) up to 0 volts for negative voltage trimming to achieve a target threshold voltage. Thus, each of the voltage generation circuits is said to operate in a single trimming mode and neither of the voltage generation circuits operates in a dual trimming mode. That is, neither of the voltage generation circuits is configured to generate selectable voltages at multiple DAC steps across a voltage range that includes both negative voltages and positive voltages. Some integrated circuit (IC) designs (e.g., IC designs in the 22 nm fully-depleted silicon-on-insulator (FDSOI) technology node) could, however, benefit from a back-bias generator with voltage generation circuits configured to operate, at least occasionally, in a dual trimming mode.

SUMMARY

In view of the foregoing, disclosed herein are embodiments of a voltage generator that includes a first voltage generation circuit and a second voltage generation circuit. However, instead of the first voltage generation circuit and the second voltage generation circuit each being operable in a single trimming mode and, particularly, in a positive trimming mode and a negative trimming mode, respectively, the first voltage generation circuit and the second voltage generation circuit are each individually and selectively operable in either a single trimming mode or a dual trimming mode. Specifically, the first voltage generation circuit is selectively operable in a single trimming mode enabling positive trimming only or in a dual trimming mode that shifts the voltage range downward enabling a somewhat smaller amount of positive trimming and also some negative trimming. The second voltage generation circuit is selectively operable in a single trimming mode enabling negative trimming only or in a dual trimming mode that shifts the voltage range upward enabling a somewhat smaller amount of negative trimming and also some positive trimming. Also disclosed herein are embodiments of an integrated circuit (IC) chip that incorporates one or more such voltage generators for back-biasing the field effect transistors in one or more circuit blocks, respectively.

More particularly, disclosed herein are embodiments of a voltage generator (e.g., a back-bias generator). This voltage generator includes a pair of voltage generation circuits and, particularly, a first voltage generation circuit and a second voltage generation circuit. Each voltage generation circuit is has different voltage ranges. Each voltage generation circuit is also individually and selectively operable in either a single trimming mode or a dual trimming mode and the specific voltage range of the voltage generation circuit will vary depending upon whether that voltage generation circuit is operating in the single trimming mode or the dual trimming mode. Specifically, the first voltage generation circuit outputs a first output voltage at a first output voltage node and this first output voltage is within a first voltage range, which is mode-dependent. When the first voltage generation circuit is operating in the single trimming mode, this first voltage range is a positive voltage range that extends from 0 volts to a predetermined positive voltage (e.g., +1.8 volts). When the first voltage generation circuit is operating in the dual trimming mode, the first voltage range shifts downward by a predetermined negative voltage shift amount (e.g., by 0.4 volts) such that the first voltage range extends from a negative voltage (e.g., −0.4 volts) to a lower positive voltage (e.g., +1.4 volts). The second voltage generation circuit outputs a second output voltage at a second output voltage node and this second output voltage is within a second voltage range, which is different from the first voltage range and which is also mode-dependent. When the second voltage generation circuit is operating in the single trimming mode, this second voltage range is a negative voltage range that extends from a predetermined negative voltage (e.g., +1.8 volts) to 0 volts. When the second voltage generation circuit is operating in the dual trimming mode, the second voltage range shifts upward by a predetermined positive voltage shift amount (e.g., by 0.4 volts) such that the second voltage range extends from a higher negative voltage (e.g., −1.4 volts) to a positive voltage (e.g., +0.4 volts).

Also disclosed herein are embodiments of an integrated circuit (IC) chip that incorporates one or more such voltage generators for back-biasing the field effect transistors in one or more circuit blocks, respectively. As discussed in greater detail in the detailed description section, the IC chip embodiments can be, for example, designed for the 22 nm fully-depleted silicon-on-insulator (22 nmFDSOI) technology node.

One embodiment of an IC chip can include a semiconductor substrate and wells (i.e., dopant implant regions) with different type conductivities within the semiconductor substrate. The wells can include at least a P-well and an N-well. The IC chip can further include at least one circuit block on the semiconductor substrate. The circuit block can include field effect transistors (FETs) above the wells and the FETs can include at least a P-type field effect transistor (PFET) and an N-type field effect transistor (NFET). The IC chip can further include a voltage generator, which is configured as described above. That is, the voltage generator can include a first voltage generation circuit that outputs a first output voltage at a first output voltage node electrically connected to the N-well and a second voltage generation circuit that outputs a second output voltage at a second output voltage node electrically connected to the P-well, wherein the first voltage generation circuit and the second voltage generation circuit are each selectively and individually operable in either a single trimming mode or a dual trimming mode.

For example, the FETs within the circuit block can be regular threshold voltage (RVT) or high threshold voltage (HVT) FETs with the PFET above the N-well and the NFET above the P-well. In this case, connection of the N-well to the first output voltage node of the first voltage generation circuit enables reverse back-biasing of the PFET (e.g., in the single trimming mode) or a limited amount of forward-back biasing of the PFET (e.g., in the dual trimming mode). Similarly, connection of the P-well to the second output voltage node of the second voltage generation circuit enables reverse back-biasing of the NFET (e.g., in the single trimming mode) or a limited amount of forward back-biasing of the NFET (e.g., in the dual trimming mode). Alternatively, the FETs within the circuit block can be super low threshold voltage (SLVT) or low threshold voltage (LVT) FETs with the PFET above the P-well and the NFET above the N-well. In this case, connection of the N-well to the first output voltage node of the first voltage generation circuit enables forward back-biasing of the NFET (e.g., in the single trimming mode) or a limited amount of reverse-back biasing of the NFET (e.g., in the dual trimming mode). Similarly, connection of the P-well to the second output voltage node of the second voltage generation circuit enables forward back-biasing of the PFET (e.g., in the single trimming mode) or a limited amount of reverse back-biasing of the NFET (e.g., in the dual trimming mode).

Another embodiment of an IC chip can include a semiconductor substrate and, on the semiconductor substrate, multiple circuit blocks (e.g., a first circuit block and a second circuit block) and multiple voltage generators (e.g., a first voltage generator and a second voltage generator). The first circuit block can include, for example, regular threshold voltage (RVT) or high threshold voltage (HVT) FETs and, specifically, can include at least an N-type HVT or RVT FET above a P-well in the semiconductor substrate and a P-type HVT or RVT FET above an N-well in the semiconductor substrate. The second circuit block can include, for example, super low threshold voltage (SLVT) or low threshold voltage (LVT) FETs and, specifically, can include at least an N-type SLVT or LVT FET above an N-well in the semiconductor substrate and a P-type SLVT or LVT FET above a P-well in the semiconductor substrate.

Each voltage generator can be configured as described above. That is, each voltage generator can include a first voltage generation circuit that outputs a first output voltage at a first output voltage node and a second voltage generation circuit that outputs a second output voltage at a second output voltage node, wherein the first voltage generation circuit and the second voltage generation circuit are each selectively and individually operable in either a single trimming mode or a dual trimming mode.

The first voltage generator can be operably connected to the first circuit block. Specifically, the first output voltage node of the first voltage generation circuit of the first voltage generator can be electrically connected to the N-well below the P-type HVT or RVT FET of the first circuit block. Furthermore, the second output voltage node of the second voltage generation circuit of the first voltage generator can be electrically connected to the P-well below the N-type HVT or RVT FET of the first circuit block. For this first circuit block, connection of the N-well to the first output voltage node of the first voltage generation circuit of the first voltage generator enables reverse back-biasing of the P-type HVT or RVT FET (e.g., in the single trimming mode) or a limited amount of forward-back biasing of the P-type HVT or RVT FET (e.g., in the dual trimming mode). Similarly, connection of the P-well to the second output voltage node of the second voltage generation circuit of the first voltage generator enables reverse back-biasing of the N-type HVT or RVT FET (e.g., in the single trimming mode) or a limited amount of forward back-biasing of the N-type HVT or RVT FET (e.g., in the dual trimming mode).

The second voltage generator can be operably connected to the second circuit block. Specifically, the first output voltage node of the first voltage generation circuit of the second voltage generator can be electrically connected to the N-well below the N-type SLVT or LVT FET of the second circuit block and the second output voltage node of the second voltage generation circuit of the second voltage generator can be electrically connected to the P-well below the P-type SLVT or LVT FET of the second circuit block. For this second circuit block, connection of the N-well to the first output voltage node of the first voltage generation circuit of the second voltage generator enables forward back-biasing of the N-type SLVT or LVT FET (e.g., in the single trimming mode) or a limited amount of reverse-back biasing of the N-type SLVT or LVT FET (e.g., in the dual trimming mode). Similarly, connection of the P-well to the second output voltage node of the second voltage generation circuit of the second voltage generator enables forward back-biasing of the P-type SLVT or LVT FET (e.g., in the single trimming mode) or a limited amount of reverse back-biasing of the N-type SLVT or LVT FET (e.g., in the dual trimming mode).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, back-biasing refers to a process wherein a voltage is applied to the back-side of the channel region of a field effect transistor opposite the gate in order to fine-tune the threshold voltage (Vt) of the FET. This process is also referred to in the art as trimming. Forward back-biasing (FBB) refers specifically to applying a voltage that will reduce the Vt of the FET, thereby increasing the switching speed. Generally, for a P-type field effect transistor (PFET), FBB is achieved by applying a negative voltage to the back-side of the channel region; whereas, for an N-type field effect transistor (NFET), FBB is achieved by applying a positive voltage to the back-side of the channel region. Reverse back-biasing (RBB) refers specifically to applying a voltage that will increase the Vt of the FET, thereby decreasing the switching speed and reducing leakage current. Generally, for a PFET, RBB is achieved by applying a positive voltage to the back-side of the channel region; whereas, for an NFET, RBB is achieved by applying a negative voltage to the back-side of the channel region.

Figure 5A:
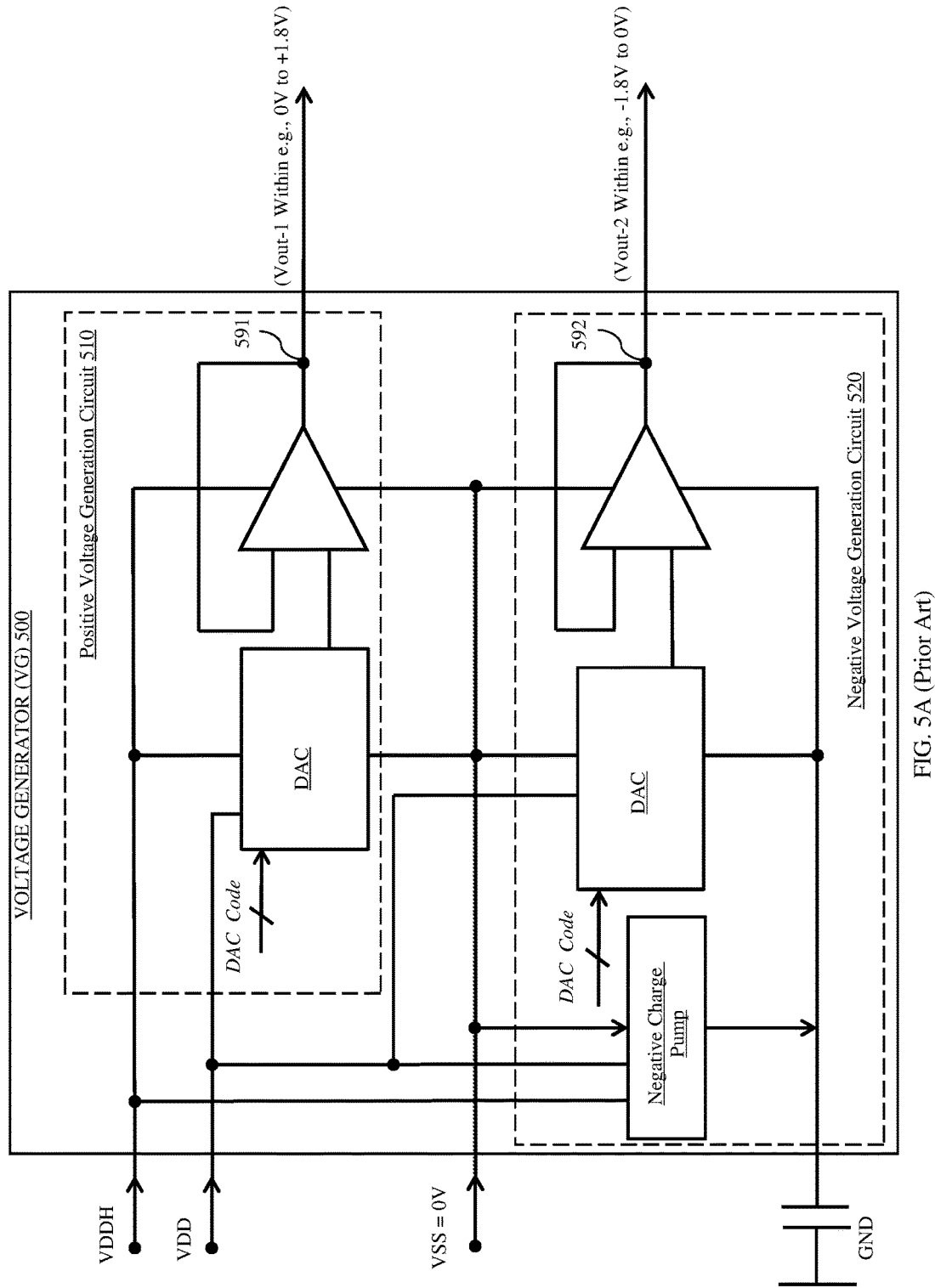
FIGS. 5A, 5B and 5C are a schematic diagram illustrating a voltage generator, a block diagram illustrating an integrated circuit (IC) chip that incorporates one or more voltage generators for back-biasing field effect transistors (FETs) within one or more circuit blocks; and a cross-section diagram illustrating a portion of an IC chip, such as the IC chip of FIG. 5B, wherein the outputs of one or more voltage generators on the chip are employed for back-biasing FETs from one or more circuit blocks, respectively, on the same chip.

FIG. 5A is a schematic diagram of an exemplary voltage generator 500, which is configured to enable back-biasing of N-type field effect transistors (NFETs) and P-type field effect transistors (PFETs) (e.g., in a given circuit block). The voltage generator 500 (also referred to as a back-bias generator) has two different voltage generation circuits 510, 520. A first voltage generation circuit 510 includes a digital-to-analog converter (DAC) that generates selectable voltages at multiple DAC steps from 0 volts to some positive voltage (e.g., to +1.8 volts) at a first output voltage node 591 for positive voltage trimming to achieve a target threshold voltage. A second voltage generation circuit 520 includes a DAC that generates selectable voltages at multiple DAC steps from some negative voltage (e.g., from −1.8 volts) up to 0 volts for negative voltage trimming to achieve a target threshold voltage. Thus, each of the voltage generation circuits 510 and 520 is said to operate in a single trimming mode and neither of the voltage generation circuits 510 and 520 operates in a dual trimming mode. That is, neither of the voltage generation circuits 510 and 520 is configured to generate selectable voltages at multiple DAC steps across a voltage range that includes both negative voltages and positive voltages.

Figure 5B:
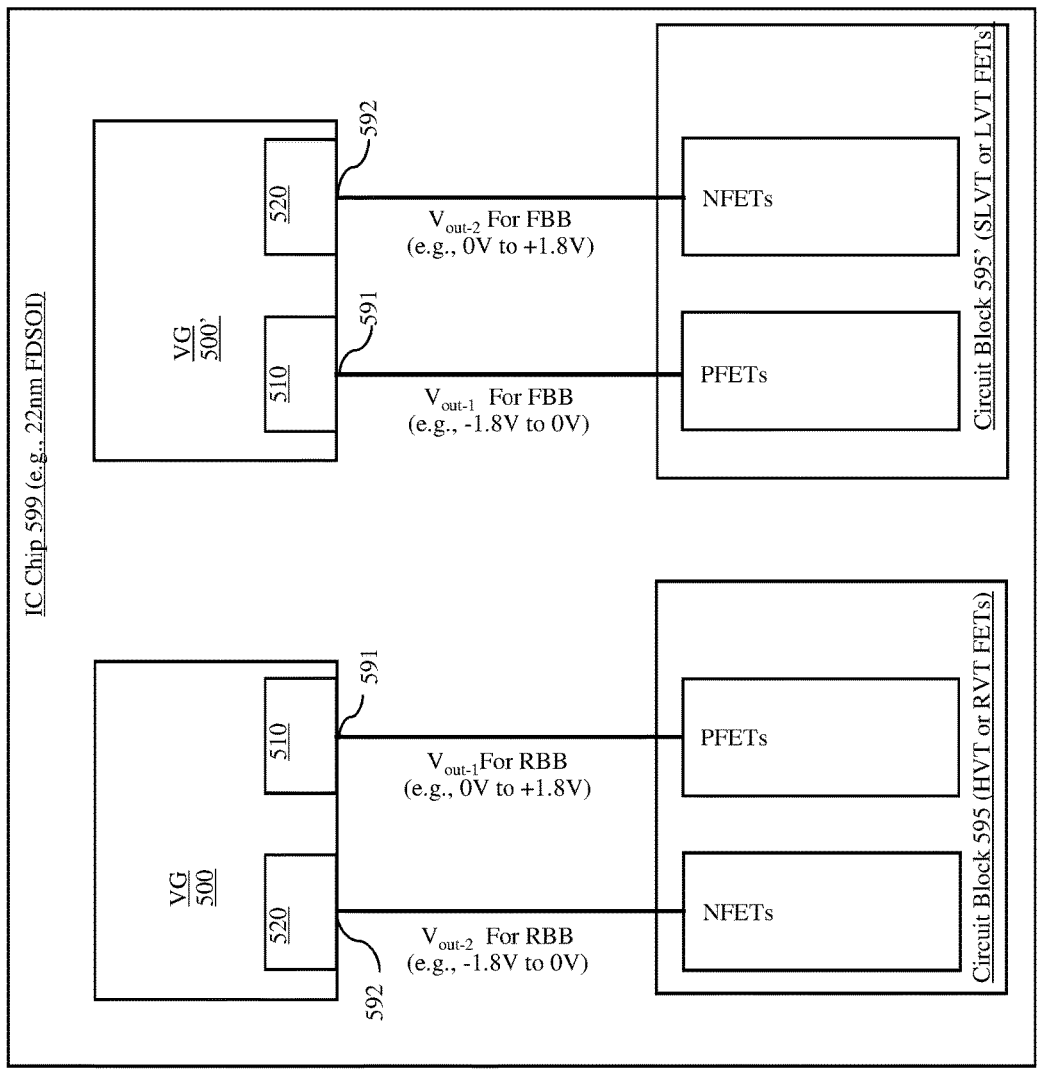

FIG. 5B is a block diagram of an exemplary integrated circuit (IC) chip 599 with one or more circuit blocks 595, 595' and one or more voltage generators 500, 500', as described above, that provide back-biasing for the PFET and NFETs of the circuit blocks 595, 595', respectively. Given that the different voltage generation circuits 510 and 520 in a given voltage generator are each only capable of single trimming (i.e., positive voltage trimming only or negative voltage trimming only), each voltage generator 500, 500' can only be used for either FBB or RBB of the PFETs and NFETs in a given block, but not for both.

Figure 5C:
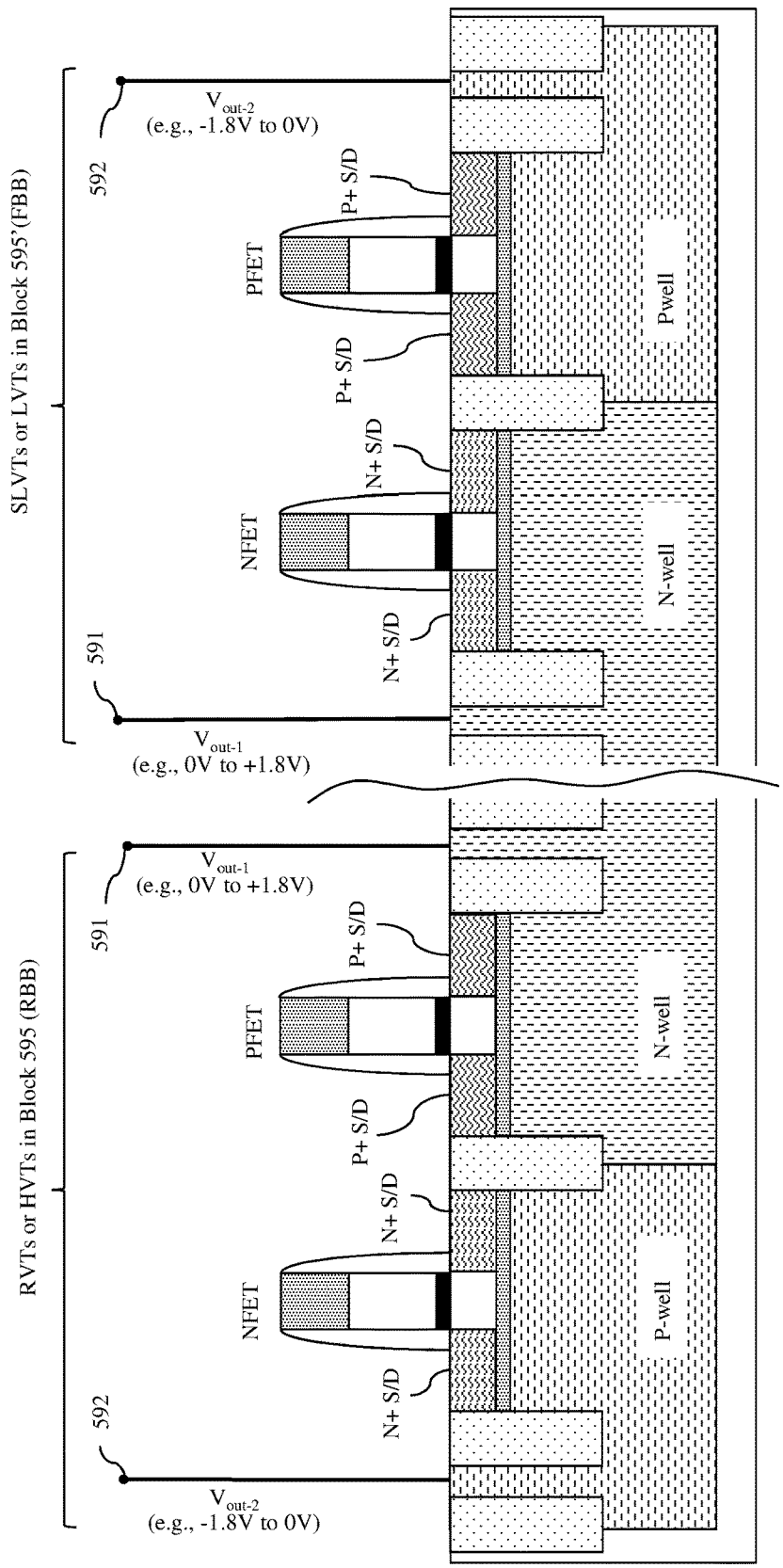

For example, referring to FIG. 5C in combination with FIGS. 5A and 5B, at the 22 nm fully-depleted silicon-on-insulator (FDSOI) technology node the PFETs and NFETs in each circuit block 595, 595' are planar and each FET includes a channel region positioned laterally between source/drain regions. The channel region and the source/drain regions of each FET are within a silicon layer and a thin insulator layer physically separates the channel region and the source/drain regions from a well (i.e., a doped implant region) within a semiconductor substrate below. The conductivity of the well varies depending upon the threshold voltage of the FETs within the circuit block and also on the conductivity-type of those FETs. Specifically, N-type regular threshold voltage (RVT) or high threshold voltage (HVT) FETs will be on an insulator layer above a P-well; whereas P-type RVT or HVT FETs will be on an insulator layer above an N-well. The well regions are, however, flipped for super low threshold voltage (SLVT) or low threshold voltage (LVT) FETs. That is, N-type SLVT or LVT FETs will be on an insulator layer above an N-well; whereas P-type SLVT or LVT FETs will be on an insulator layer above a P-well. Those skilled in the art will recognize that FETs with different threshold voltage levels (e.g., RVTs, HVTs, LVTs, SLVTs, etc.) will be configured differently. For example, such FETs will have differences in channel doping, halo implants, gate lengths and/or differences in any other parameter that alone or in combination with differences in other parameters can impact threshold voltage).

As mentioned above, due to the single trimming nature of the voltage generation circuits 510 and 520, each voltage generator 500, 500' on the IC chip 599 can either be used for RBB or for FBB of the FETs in a given block, but not both. Since the design goal of RVT and HVT FETs is a relatively slow switching speed, RBB of RVT and HVT FETs to increase the threshold voltage is typically needed to reach a target threshold voltage and, thereby a target switching speed. Thus, for a circuit block 595 that contains RVT or HVT FETs, the P-well below an N-type RVT or HVT FET will be connected to the second output voltage node 592 of the second voltage generation circuit 520 of the voltage generator 500 for RBB using a second output voltage (Vout-2) that is between −1.8 volts and 0 volts; whereas the N-well below a P-type RVT or HVT FET will be connected to the first output voltage node 591 of the first voltage generation circuit 510 of the same voltage generator 500 for RBB with a first output voltage (Vout-1) that is between 0 volts and +1.8 volts. However, since the design goal of SLVT and LVT FETs is a relatively fast switching speed, FBB of SLVT or LVT FETs to decrease the threshold voltage is typically needed to reach a target threshold voltage and, thereby a target switching speed. Thus, for a circuit block 595' that contains SLVT or LVT FETs, the N-well below a N-type SLVT or LVT FET will be connected to the first output voltage node 591 of the first voltage generation circuit 510 of the voltage generator 500' for FBB with a first output voltage (Vout-1') that is between 0 volts and +1.8 volts; whereas the P-well below a P-type SLVT or LVT PFET will be connected to the second output voltage node 592 of the second voltage generation circuit 520 of the same voltage generator 500' for FBB with a second output voltage (Vout-2') that is between −1.8 volts and 0 volts.

While it may typically be necessary to reverse-back bias RVT and HVT FETs to increase the threshold voltage and thereby decrease the switching speed to reach the target threshold voltage and target switching speed and while it may also typically be necessary to forward-back bias SLVT and LVT FETs to decrease the threshold voltage and thereby increase the switching speed to reach the target threshold voltage and target switching speed, sometimes process variations may result in the P-type and/or N-type RVT or HVT FETs in a given circuit block with a slower switching speed than necessary or may result in the P-type and/or N-type SLVT or LVT FETs in another circuit block with a faster switching speed than necessary. Therefore, it would be advantageous to have a voltage generator with a pair of voltage generation circuits that are each capable of dual trimming so that, for RVT or HVT FETS, RBB and, optionally, some level of FBB could be performed and further so that, for SLVT or LVT FETs, FBB and, optionally, some level of RBB can be performed.

In view of the foregoing, disclosed herein are embodiments of a voltage generator that includes a first voltage generation circuit and a second voltage generation circuit. However, instead of the first voltage generation circuit and the second voltage generation circuit each being operable in a single trimming mode and, particularly, in a positive trimming mode and a negative trimming mode, respectively, the first voltage generation circuit and the second voltage generation circuit are each individually and selectively operable in either a single trimming mode or a dual trimming mode. Specifically, the first voltage generation circuit is selectively operable in a single trimming mode enabling positive trimming only or in a dual trimming mode that shifts the voltage range downward enabling a somewhat smaller amount of positive trimming and also some negative trimming. The second voltage generation circuit is selectively operable in a single trimming mode enabling negative trimming only or in a dual trimming mode that shifts the voltage range upward enabling a somewhat smaller amount of negative trimming and also some positive trimming. Also disclosed herein are embodiments of an integrated circuit (IC) chip that incorporates one or more such voltage generators for back-biasing the field effect transistors in one or more circuit blocks, respectively.

Figure 1:
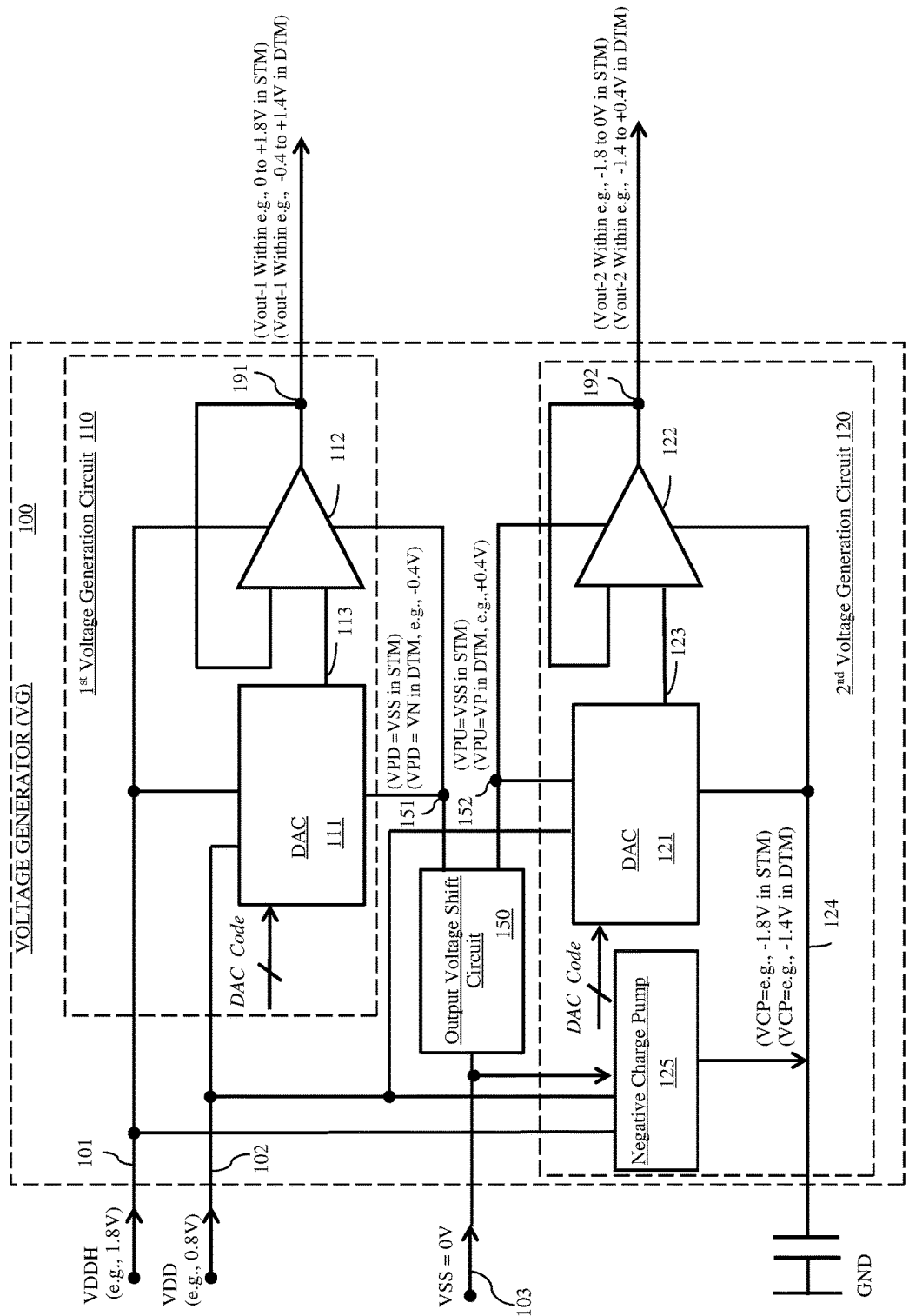
FIG. 1 is a schematic diagram illustrating an embodiment of a voltage generator.

More particularly, disclosed herein are embodiments of a voltage generator 100 (e.g., a back-bias generator) (see FIG. 1).

This voltage generator 100 includes a first voltage generation circuit 110, a second voltage generation circuit 120, and an output voltage shift circuit 150 operably connected to the first voltage generation circuit 110 at a voltage pull-down node 151 and operably connected to the second voltage generation circuit 120 at a voltage pull-up node 152.

The first voltage generation circuit 110 includes a first digital-to-analog converter (DAC) 111 (e.g., an N-bit DAC), which is operably connected to a first positive voltage rail 101 at a first positive supply voltage level (VDDH) (e.g., +1.8 volts), to a second positive voltage rail 102 at a second positive supply voltage level (VDD) (e.g., +0.8 volts) that is less than the first positive supply voltage level and to the voltage pull-down node 151. The first voltage generation circuit 110 further has a first operational amplifier 112 connected between the first DAC 111 and a first output voltage node 191. The first voltage generation circuit 110 outputs a first output voltage (Vout-1) at this first output voltage node 191 and the first output voltage (Vout-1) will be set at one of multiple uniformly spaced DAC steps (e.g., 0.4V DAC steps) across a first voltage range. For example, if the first DAC is a 3-bit DAC, the first output voltage (Vout-1) will be at one of eight uniformly spaced DAC steps (i.e., DAC step 0 to DAC step 7) across the first voltage range. In operation, the first DAC 111 receives a first digital code (e.g., an N-bit DAC code) indicating a specific DAC step (e.g., DAC step 0, 1, 2, 3, etc.) and, in response, outputs a corresponding first voltage signal 113 to the first operational amplifier 112. With this configuration, the magnitude of the first voltage signal 113 and, thereby the magnitude of the first output voltage (Vout-1) will depend upon: (a) the magnitude of the pull-down voltage (VPN) at the voltage pull-down node 151; (b) the magnitude of VDDH; and (c) the value of the first digital code.

This first voltage generation circuit 110 can be individually and selectively operable in either a single trimming mode or a dual trimming mode. The magnitude of the pull-down voltage (VPN) at the pull-down node 151 depends upon whether the first voltage generation circuit 110 is operating in the single trimming mode or the dual trimming mode. Specifically, when the first voltage generation circuit 110 is operating in the single trimming mode, the pull-down voltage (VPD) at the voltage pull-down node 151 can be set by the output voltage shift circuit 150, as discussed in greater detail below, at VSS (e.g., 0 volts). Thus, when the first voltage generation circuit 110 is operating in the single trimming mode, the first voltage range within which the DAC steps are essentially uniformly spaced and within which the first output voltage (Vout-1) will fall is a positive voltage range that extends from VSS to the first positive supply voltage level (VDDH) (e.g., from 0 to +1.8 volts). However, when the first voltage generation circuit 110 is operating in the dual trimming mode, the pull-down voltage (VPD) at the voltage pull-down node 151 can be set by the output voltage shift circuit 150, as discussed in greater detail below, at a predetermined negative voltage (VN) that is less than VSS (e.g., that is −0.4 volts). Thus, when the first voltage generation circuit 110 is operating in the dual trimming mode, the first voltage range within which the DAC steps are uniformly spaced and within which the first output voltage (Vout-1) will fall is shifted downward by a predetermined negative voltage shift amount (e.g., by 0.4 volts or by 1 DAC step) from VSS to VN such that the first voltage range extends from the predetermined negative voltage (VN) to a somewhat lower positive voltage (e.g., +1.4 volts). It should be understood that VDDH is set by design and the first DAC code is selected (e.g., by a user or automatically by software) to indicate a specific DAC level required to achieve a desired first output voltage (Vout-1) given operation in the single or dual trimming mode. Thus, when operating in the single trimming mode, the first voltage generation circuit 110 enables positive trimming only and, when operating in the dual trimming mode, the first voltage generation circuit 110 enables a somewhat smaller amount of positive trimming and also some negative trimming.

The second voltage generation circuit 120 includes a second digital-to-analog converter (DAC) 121 (e.g., another N-bit DAC), which is operably connected to the second positive voltage rail 102 at the second positive supply voltage level (VDD) (e.g., at +0.8 volts), to the voltage pull-up node 152 and to a negative voltage rail 124. The second voltage generation circuit 120 further has a negative charge pump 125 operably connected to the output voltage shift circuit 150 and to the negative voltage rail 124 for setting the magnitude of a negative charge pump voltage (Vcp) (also referred to as a negative supply voltage). The second voltage generation circuit 120 further has a second operational amplifier 122 connected between the second N-bit DAC 121 and a second output voltage node 192. The second voltage generation circuit 120 outputs second output voltage (Vout-2) at this second output voltage node 192 and the second output voltage (Vout-2) will be at one of multiple uniformly spaced DAC steps across a second voltage range.

For example, if the second DAC 121 is a 3-bit DAC, the second output voltage (Vout-2) will be at one of eight uniformly spaced DAC steps (i.e., DAC step 0 to DAC step 7) across the second voltage range. In operation, the second DAC 121 receives a second digital code (e.g., another N-bit DAC code) indicating a specific DAC step (e.g., 0, 1, 2, 3, etc.) and, in response, outputs a corresponding second voltage signal 123 to the second operational amplifier 122. With this configuration, the magnitude of the second voltage signal 123 and, thereby the magnitude of the second output voltage (Vout-2) will depend upon: (a) the magnitude of the pull-up voltage (VPU) at the voltage pull-up node 152; (b) the magnitude of VCP; and (c) the value of the second digital code.

Like the first voltage generation circuit 110, the second voltage generation circuit 120, can be individually and selectively operable in either a single trimming mode or a dual trimming mode. The magnitude of the pull-up voltage (VPU) at the voltage pull-up node 152 and the magnitude of the negative supply voltage (VCP) established by the negative charge pump 125 and applied to the negative voltage rail 124 each depend upon whether the second voltage generation circuit 120 is operating in the single trimming mode or the dual trimming mode. Specifically, when the second voltage generation circuit 120 is operating in the single trimming mode, the pull-up voltage (VPU) at the voltage pull-up node 152 can be set by the output voltage shift circuit 150, as discussed in greater detail below, at VSS (e.g., at 0 volts). Furthermore, the negative supply voltage (VCP) established by the negative charge pump 125 and applied to the negative voltage rail 124 can be set, for example, at −1.8 volts. Thus, when the second voltage generation circuit 120 is operating in the single trimming mode, the second voltage range within which the DAC steps are uniformly spaced and within which the second output voltage (Vout-2) will fall is a negative voltage range that extends from VCP (e.g., −1.8 volts) to VSS (e.g., 0 volts). However, when the second voltage generation circuit 120 is operating in the dual trimming mode, the pull-up voltage (VPN) at the voltage pull-up node 152 can be set by the output voltage shift circuit 150, as discussed in greater detail below, at a predetermined positive voltage (VP) (e.g., +0.4 volts) that is greater than VSS. Furthermore, the negative supply voltage (VCP) established by the negative charge pump 125 and applied to the negative voltage rail 124 can be raised by that same positive voltage amount (e.g., by +0.4 volts from −1.8 to −1.4 volts). Thus, when the second voltage generation circuit 120 is operating in the dual trimming mode, the second voltage range within which the DAC steps are uniformly spaced and within which the second output voltage (Vout-2) will fall is shifted upward by a predetermined positive voltage shift amount (e.g., by 0.4 volts or by 1 DAC step) from VSS to VP such that the first voltage range extends from the somewhat higher negative voltage (e.g., −1.4 volts) to a predetermined positive voltage (VP) (e.g., to +0.4 volts). It should be understood that the N-bit DAC code is selected (e.g., by a user or automatically by software) to specify a specific DAC level required to achieve a desired second output voltage (Vout-2) given operation in the single or dual trimming mode. Thus, when operating in the single trimming mode, the second voltage generation circuit 120 enables negative trimming only and, when operating in the dual trimming mode, the second voltage generation circuit 120 enables a somewhat smaller amount of negative trimming and also some positive trimming.

It should be understood that the control signals for the voltage generator 100 including, but not limited to, the first DAC code supplied to the first DAC 111 of the first voltage generation circuit 110 and the second DAC code supplied to the second DAC 121 of the second voltage generation circuit 120 can be generated by a controller (not shown). The first DAC code and the second DAC code are independent such that there is no symmetry or relationship between the first output voltage and the second output voltage. As mentioned above, a DAC code will indicate a specific DAC step (e.g., DAC step 0, 1, 2, 3, etc.) and the optimal DAC step for the first DAC 111 and the optimal DAC step for the second DAC 121 can each be determined by the controller based, for example, on the results of NFET and PFET performance tests.

Figure 2:
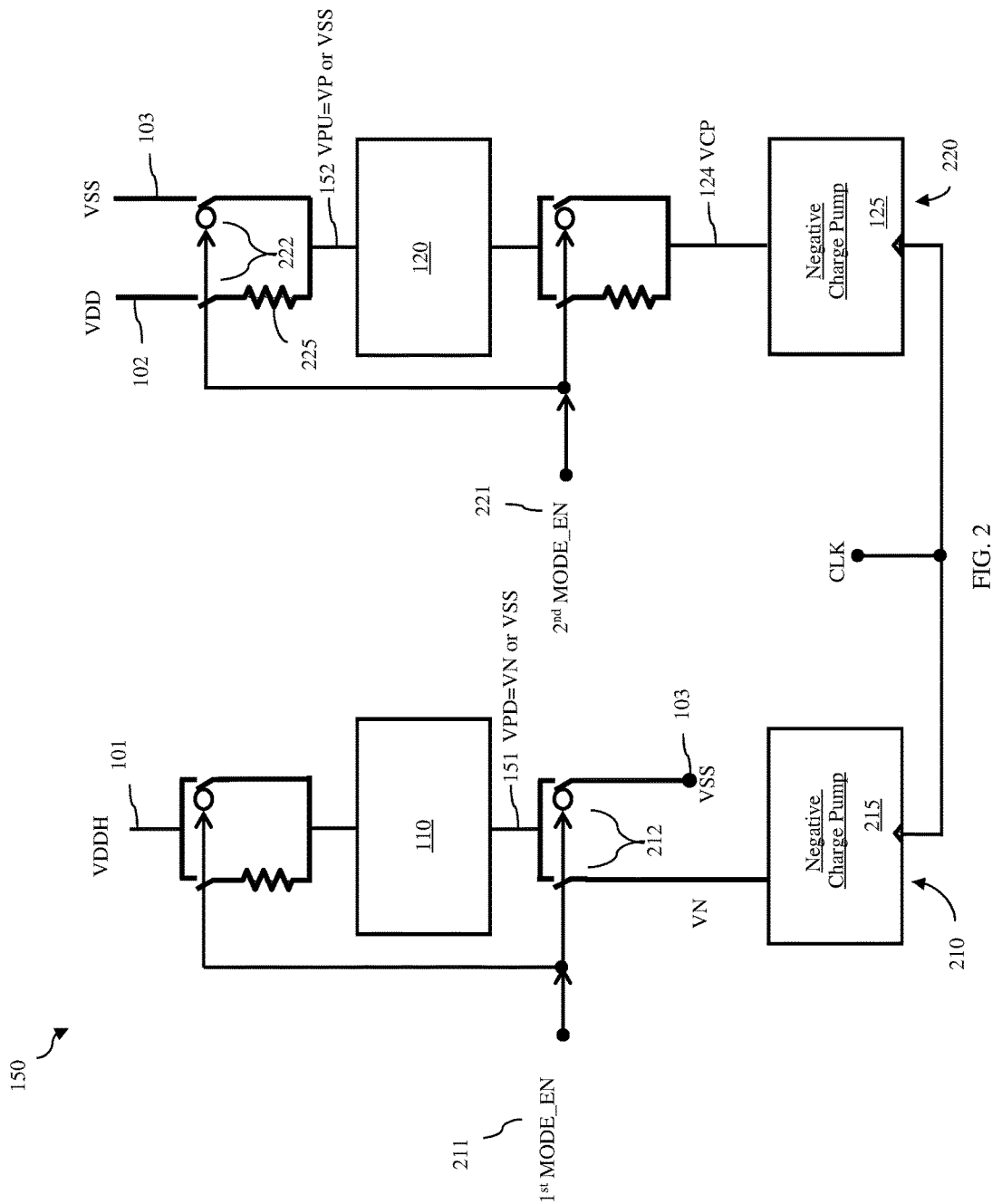
FIG. 2 is a schematic diagram illustrating an exemplary output voltage shift circuit that can be incorporated into the voltage generator of FIG. 1.

FIG. 2 is a schematic diagram illustrating one exemplary output voltage shift circuit 150 that can be incorporated into the voltage generator 100 for purposes of adjusting the pull-down voltage (VPD) at the voltage pull-down node 151 depending upon the mode selected for operation of the first voltage generation circuit 110 and also for purposes of adjusting the pull-up voltage (VPU) on the voltage pull-up node 152 depending upon the mode selected for operation of the second voltage generation circuit 120.

This output voltage shift circuit 150 can include a first leg 210 connected to the voltage pull-down node 151 and, thereby to the first voltage generation circuit 110. The first leg 210 can further include a plurality of first switches 212, which are controlled by a first mode enable signal 211. When the value of the first mode enable signal 211 is a "0", the first switches 212 will selectively connect the voltage pull-down node 151 to a VSS voltage rail (e.g., a zero voltage rail) to apply VSS (e.g., 0 volts) to that voltage pull-down node 151 (thereby causing the first voltage generation circuit 110 to operate in the single trimming mode); whereas, when the first mode enable signal 211 is a "1", the first switches 212 will selectively connect the voltage pull-down node 151 to the output of an additional negative charge pump 215 to apply the predetermined negative voltage (VN) to that voltage pull-down node 151 (thereby causing the first voltage generation circuit 110 to operate in dual trimming mode).

This output voltage shift circuit 150 can also include a second leg 220 connected to the voltage pull-up node 152 and, thereby the second voltage generation circuit 120. The second leg 220 can further include a plurality of second switches 222, which are controlled by a second mode enable signal 221. When the value of the second mode enable signal 221 is a "0", the second switches 222 will selectively connect the voltage pull-up node 152 to the VSS voltage rail 103 to to apply VSS (e.g., 0 volts) to that voltage pull-up node 152 (thereby causing the second voltage generation circuit 120 to operate in the single trimming mode); whereas, when the value of the second mode enable signal 221 is a "1", the second switches 222 will selectively connect the voltage pull-up node 152 to the second positive supply voltage (VDD) (e.g., +0.8 volts) through a resistor 225. The size of the resistor 225 is such that the voltage drop across the resistor 225 will be a predetermined amount (e.g., 0.4 volts) so that a predetermined positive voltage (VP) (e.g., +0.4 volts) is applied to that voltage pull-up node 152 (thereby causing the second voltage generation circuit 120 to operate in the dual trimming mode).

The mode select enable signals 211 and 221 can, for example, be output by a control circuit (not shown). Alternatively, given the overlap in possible first output voltages when the first voltage generation circuit 110 is operating in the single trimming mode or the dual trimming mode and given that the dual trimming mode can shift the first voltage range downward by a single DAC step, the first voltage generation circuit 110 can, optionally, only be operated in the dual trimming mode when a negative output voltage at the first output voltage node 191 is warranted. In this case, instead of using a discrete first mode enable signal 211 output from a control circuit to trigger the first switches 212 (i.e., to cause the first switches 212 to connect the voltage pull-down node 151 to VN as opposed to VSS), the first DAC code can be a dual-purpose signal used as an input to both the first DAC 111 of the first voltage generation circuit 110 and as an input to a first logic block (not shown) that generates the first mode select signal 211 for the first leg 210 of the output voltage shift circuit 150. For example, if the first DAC 111 is a 3-bit DAC and the first DAC code is anything other than "000", the first logic block can set the value of the first mode select signal 211 to "0" causing the first switches 212 to connect the voltage pull-down node 151 to VSS (e.g., 0 volts). This same first DAC code will indicate the specific higher level DAC step (e.g., DAC step 1, 2, . . . , 7) for use in the single trimming mode. However, if the first DAC code is "000", the first logic block can switch the value of the first mode select signal 211 to "1" causing the first switches 212 to connect the voltage pull-down node 151 to VN. At this lowest DAC step (i.e., DAC step 0), the first voltage output (Vout-1) will be equal to VN (e.g., equal to −0.4 volts). Additionally, instead of using a discrete second mode enable signal 221 output from a control circuit to trigger the second switches 222 (i.e., to cause the second switches 222 to connect the voltage pull-up node 152 to VP as opposed to VSS), the second DAC code can be a dual-purpose signal used as an input to both the second DAC 121 of the second voltage generation circuit 120 and as an input to a second logic block (not shown) that generates the second mode select signal 221 for the second leg 220 of the output voltage shift circuit 150. For example, if the second DAC 121 is a 3-bit DAC and the second DAC code is anything other than "111", the second logic block can set the value of the second mode select signal 221 to "0" causing the second switches 222 to connect the voltage pull-up node 152 to VSS. This same second DAC code will indicate the specific DAC step (e.g., DAC step 0, 2, . . . , 6.) for use in the single trimming mode. However, if the second DAC code is "111", the second logic block can switch the value of the second mode select signal 221 to a "1", causing the second switches 222 to connect the voltage pull-up node 152 to VDD through the resistor 225 such that VP is applied to the voltage pull-up node 152. At this highest DAC step (i.e., DAC step 7), the second voltage output (Vout-2) will be equal to VP (e.g., +0.4 volts).

It should be noted that the exemplary output voltage shift circuit 150 shown in FIG. 2 is offered for illustration purposes and is not intended to be limiting. Alternatively, any other suitable output voltage shift circuit 150, which is configured to allow for the selective adjustment of the the pull-down voltage (VPD) at the voltage pull-down node 151 and also configured to allow for the selective adjustment of the pull-up voltage (VPU) on the voltage pull-up node 152, could be incorporated into the voltage generator 100.

Figure 3:
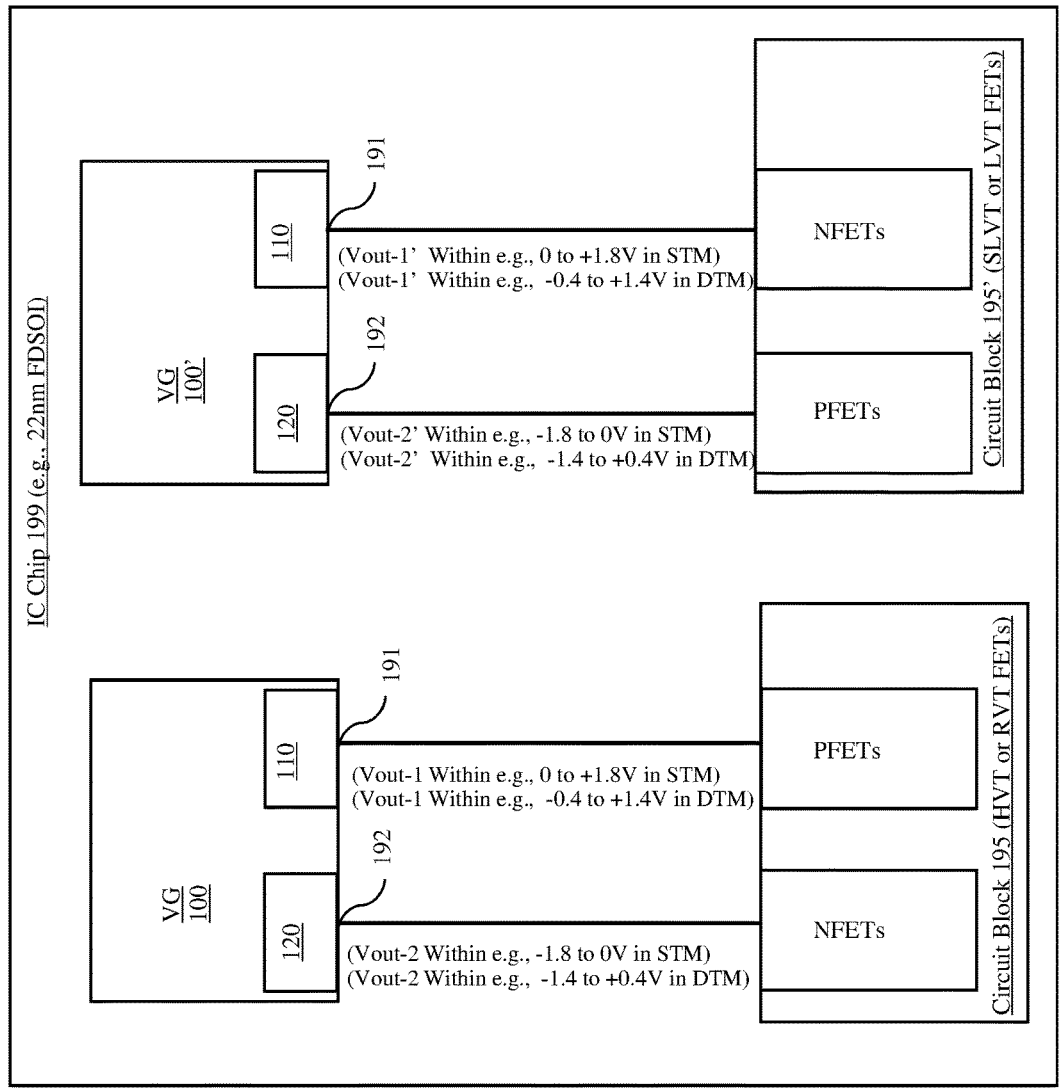
FIG. 3 is a block diagram illustrating integrated circuit (IC) chip that incorporates one or more voltage generators for back-biasing field effect transistors (FETs) within one or more circuit blocks.
Figure 4:
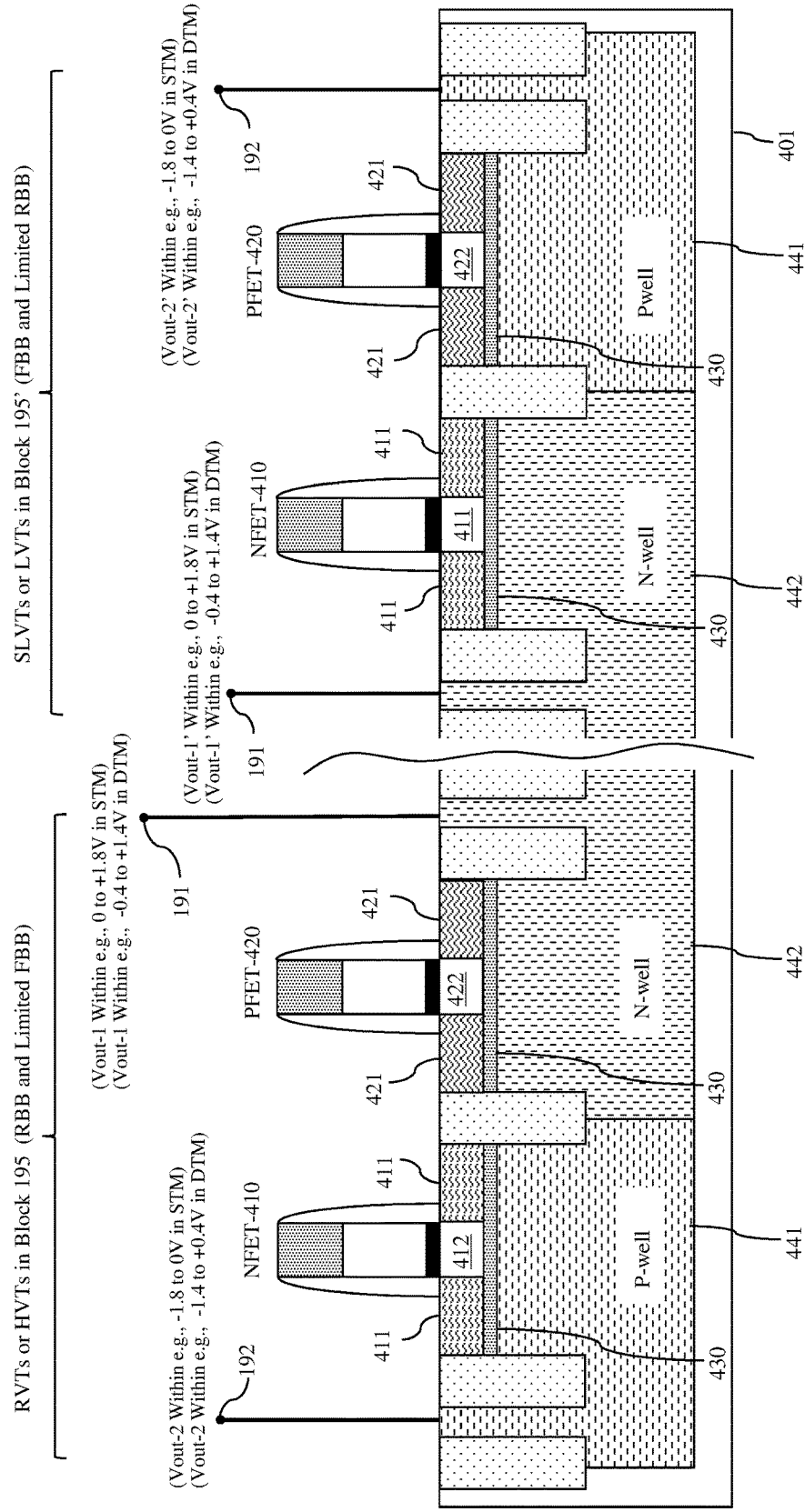
FIG. 4 is a cross-section diagram illustrating a portion of an IC chip, such as the IC chip of FIG. 3, wherein the outputs of one or more voltage generators on the chip are employed for back-biasing FETs in one or more circuit blocks, respectively, on the same chip.

Referring to FIGS. 3 and 4 in combination with FIGS. 1 and 2, also disclosed herein are embodiments of an integrated circuit (IC) chip 199 that incorporates one or more voltage generators for back-biasing field effect transistors (FETs) within one or more circuit blocks.

The IC chip 199 can be designed, for example, for the 22 nm fully-depleted silicon-on-insulator (22 nmFDSOI) technology node. Specifically, the IC chip 199 can include a semiconductor substrate 401 (e.g., a silicon substrate) and wells (i.e., dopant implant regions) with different type conductivities within the semiconductor substrate. The wells can include one or more P-wells 441 and one or more N-wells 442.

The IC chip 199 can further include at least one circuit block (e.g., see the first circuit block 195 and the second circuit block 195') on the semiconductor substrate 401.

Each circuit block 195, 195' can include field effect transistors (FETs) above the wells 441-442. The FETs can include at least an N-type field effect transistor (NFET) 410 and a P-type field effect transistor (PFET) 420.

Each NFET 410 can include a channel region 412 (e.g., an intrinsic or P-doped channel region) positioned laterally between a pair of N+ source/drain regions 411. The channel region 412 and the N+ source/drain regions 411 can be within a semiconductor layer (e.g., a silicon layer) and a thin insulator layer 430 (e.g., a thin silicon dioxide layer or some other suitable insulator layer) can physically separate the channel region 412 and the source/drain regions 411 from a well within the semiconductor substrate 401 below.

Each PFET 420 can include a channel region 422 (e.g., an intrinsic or N-doped channel region) positioned laterally between a pair of P+ source/drain regions 421. The channel region 422 and the P+ source/drain regions 421 can be within a semiconductor layer (e.g., a silicon layer) and a thin insulator layer 430 (e.g., a thin silicon dioxide layer or some other suitable insulator layer) can physically separate the channel region 422 and the P+ source/drain regions 421 from a different well within the semiconductor substrate 401 below.

It should be noted that the conductivity type of the wells below the FETs in each circuit block 195, 195' can vary depending upon the threshold voltage of the FETs within that circuit block and also on the conductivity-type of the FETs. For example, the first circuit block 195 can include, for example, regular threshold voltage (RVT) or high threshold voltage (HVT) FETs and, specifically, can include at least an NFET 410, which is an HVT or RVT FET, above a P-well 441 in the semiconductor substrate 401 and a PFET 420, which is an HVT or RVT FET, above an N-well 442 in the semiconductor substrate 401. The second circuit block 195' can include, for example, super low threshold voltage (SLVT) or low threshold voltage (LVT) FETs and, specifically, can include at least an NFET 410, which is a SLVT or LVT FET, above an N-well 442 in the semiconductor substrate 401 and a PFET 420, which is a SLVT or LVT FET, above a P-well 441 in the semiconductor substrate 401. Those skilled in the art will recognize that RVT FETs, HVT FETs, SLVT FETs, LVT FETs etc. will have various design specifications (e.g., dopant concentrations, gate dielectric thicknesses, etc.) that vary with the goal of achieving specific target threshold voltages and, thereby specific target switching speeds. However, as discussed above due to process variations, the specific target threshold voltages may not be met and, thus, some level of reverse back-biasing (RBB) or forward back-biasing (FBB) may be required to reach the target threshold voltage and, thereby the target switching speeds.

Thus, the IC chip 199 can further include at least one voltage generator (see the first voltage generator 100 and the second voltage generator 100'). The voltage generator(s) 100, 100' can each be configured as described in detail above and illustrated in FIGS. 1-2. That is, each voltage generator 100, 100' can include a first voltage generation circuit 110 that outputs a first output voltage (Vout-1) at a first output voltage node 191 electrically connected to an N-well 442 and a second voltage generation circuit 120 that outputs a second output voltage (Vout-2) at a second output voltage node 192 electrically connected to a P-well 441, wherein the first voltage generation circuit 110 and the second voltage generation circuit 120 are each selectively and individually operable in either a single trimming mode or a dual trimming mode.

The first voltage generator 100 can be operably connected to the first circuit block 195 so that reverse-back biasing (RBB) or at least some level of forward-back biasing (FBB) can be selectively applied to the P-type RVT or HVT FETs in the first circuit block 195 and so that reverse-back biasing (RBB) or at least some level of forward-back biasing (FBB) can be selectively applied to the N-type RVT or HVT FETs in the first circuit block 195. Specifically, since the design goal of RVT and HVT FETs is a relatively slow switching speed, RBB to increase the threshold voltage is typically needed to achieve the target threshold voltage and, thereby the target switching speed. Thus, for the first circuit block 195 that contains RVT or HVT FETs, the P-wells 441 below the N-type RVT or HVT FETs will be connected to the second output voltage node 192 of the second voltage generation circuit 120 of the first voltage generator 100 and the N-wells 442 below the P-type RVT or HVT FETs will be connected to the first output voltage node 191 of the first voltage generation circuit 110 of the same first voltage generator 100. Operation of the first voltage generation circuit 110 of the first voltage generator 100 in the single trimming mode will provide RBB using a first output voltage (Vout-1) that is at some selected DAC level between 0 volts and +1.8 volts to further increase the threshold voltage of the P-type RVT or HVT FETs and thereby reduce the switching speeds of the P-type RVT or HVT FETs. However, operation of the first voltage generation circuit 110 of the first voltage generator 100 could, alternatively, be switched to the dual trimming mode (e.g., if performance testing indicates that the P-type RVT or HVT FETs in this first circuit block 195 are actually operating at a slower switching speed than desired). In the dual trimming mode, a slight amount of FBB could be performed using a first output voltage (Vout-1) that is at VN (e.g., at −0.4 volts) to slightly decrease the threshold voltage and thereby increase the switching speed of the P-type RVT or HVT FETs. Operation of the second voltage generation circuit 120 of the first voltage generator 100 in the single trimming mode enables RBB of the N-type RVT or HVT FETs in the first circuit block 195 using a second output voltage (Vout-2) that is at some selected DAC level between −1.8 volts and 0 volts to further increase the threshold voltage and thereby decrease the switching speed of those N-type RVT or HVT FETs. However, operation of the second voltage generation circuit 120 of the first voltage generator 100 could, alternatively, be switched to the dual trimming mode (e.g., if performance testing indicates that the N-type RVT or HVT FETs in this first circuit block 195 are actually operating at a slower switching speed than desired). In the dual trimming mode, a slight amount of FBB could, instead, be performed using a second output voltage (Vout-2) that is at VP (e.g., +0.4 volts) to slightly decrease the threshold voltage and thereby increase the switching speed of the N-type RVT or HVT FETs.

The second voltage generator 100' can be operably connected to the second circuit block 195' so that FBB or some level of RBB can be selectively applied to the P-type SLVT or LVT FETs in this second circuit block 195' and so that FBB or some level of RBB can also be selectively applied to the N-type SLVT or LVT FETs in the second circuit block 195'. Since the design goal of SLVT and LVT FETs is a relatively fast switching speed, FBB to decrease the threshold voltage is typically needed to achieve the target threshold voltage and, thereby the target switching speed. Thus, for the second circuit block 195' that contains SLVT or LVT FETs, the N-wells 442 below the N-type SLVT or LVT FETs will be connected to the first output voltage node 191 of the first voltage generation circuit 110 of the second voltage generator 100' and the P-wells 441 below the P-type SLVT or LVT FETs will be connected to the second output voltage node 192 of the second voltage generation circuit 120 of the same second voltage generator 100'. Operation of the first voltage generation circuit 110 of the second voltage generator 100' in the single trimming mode will provide FBB using a first output voltage (Vout-1) that is at some selected DAC level between 0 volts and +1.8 volts to further decrease the threshold voltage of the N-type SLVT or LVT FETs and thereby increase the switching speed of those FETs. However, operation of the first voltage generation circuit 110 of the second voltage generator 100' could, alternatively, be switched to the dual trimming mode (e.g., if performance testing indicates that the N-type SLVT or LVT FETs in the second circuit block 195' are actually operating at a faster switching speed than desired). In the dual trimming mode, a slight amount of RBB could be performed using a first output voltage (Vout-1) that is at VN (e.g., −0.4 volts) to slightly increase the threshold voltage and thereby decrease the switching speed of the N-type SLVT or LVT FETs. Operation of the second voltage generation circuit 120 of the second voltage generator 100' in the single trimming mode enables FBB of the P-type SLVT or LVT FETs in the second circuit block 195' using a second output voltage (Vout-2) that is at some selected DAC level between −1.8 volts and 0 volts to further decrease the threshold voltage and increase the switching speed of those P-type SLVT or LVT FETs. However, operation of the second voltage generation circuit 120 of the second voltage generator 100' could, alternatively, be switched to the dual trimming mode (e.g., if performance testing indicates that the P-type SLVT or LVT FETs in this second circuit block 195' are actually operating at a faster switching speed than desired). In the dual trimming mode, a slight amount of RBB could, instead, be performed using a second output voltage (Vout-2) that is at VP (e.g., +0.4 volts) to slightly increase the threshold voltage and thereby decrease the switching speed of those P-type SLVT or LVT FETs.

It should be understood that in the embodiments described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should further be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A voltage generator comprising:
a first voltage generation circuit outputting a first output voltage at a first output voltage node; and
a second voltage generation circuit outputting a second output voltage at a second output voltage node,
wherein each voltage generation circuit is selectively and individually operable in either a single trimming mode or a dual trimming mode.

2. The voltage generator of claim 1, further comprising an output voltage shift circuit operably connected to the first voltage generation circuit and the second voltage generation circuit,
wherein the output voltage shift circuit shifts a first voltage range of the first voltage generation circuit depending upon whether the first voltage generation circuit is operating in the single trimming mode or the dual trimming mode and further shifts a second voltage range of the second voltage generation circuit depending upon whether the second voltage generation circuit is operating in the single trimming mode or the dual trimming mode,
wherein the first output voltage is within the first voltage range,
wherein, when the first voltage generation circuit is operating in the single trimming mode, the first voltage range is from 0 volts to a predetermined positive voltage,
wherein, when the first voltage generation circuit is operating in the dual trimming mode, the first voltage range shifts downward by a predetermined negative voltage shift amount,
wherein the second output voltage is within the second voltage range,
wherein, when the second voltage generation circuit is operating in the single trimming mode, the second voltage range is from a predetermined negative voltage to 0 volts, and
wherein, when the second voltage generation circuit is operating in the dual trimming mode, the second voltage range shifts upward by a predetermined positive voltage shift amount.

3. The voltage generator of claim 2,
wherein the output voltage shift circuit comprises a voltage pull-down node and a voltage pull-up node,
wherein the first voltage generation circuit comprises: a first digital-to-analog converter operably connected to a first positive voltage rail, a second positive voltage rail and to the voltage pull-down node; and a first operational amplifier connected between the first digital-to-analog converter and the first output voltage node, the first digital-to-analog converter receiving a first digital code and outputting a corresponding first voltage signal to the first operational amplifier, wherein a magnitude of the first voltage signal depends upon the first digital code and a pull-down voltage at the voltage pull-down node and wherein a magnitude of the pull-down voltage depends upon whether the first voltage generation circuit is operating in the single trimming mode or the dual trimming mode, and
wherein the second voltage generation circuit comprises: a second digital-to-analog converter operably connected to the second positive voltage rail, to the voltage pull-up node and to a negative voltage rail; a negative charge pump connected to the negative voltage rail; and a second operational amplifier connected between the second digital-to-analog converter and the second output voltage node, the second digital-to-analog converter receiving a second digital code and outputting a corresponding second voltage signal to the second operational amplifier, wherein a magnitude of the second voltage signal depends upon the second digital code and a pull-up voltage at the voltage pull-up node and wherein a magnitude of the pull-up voltage depends upon whether the second voltage generation circuit is operating in the single trimming mode or the dual trimming mode.

4. The voltage generator of claim 3, wherein the output voltage shift circuit further comprises:
a first leg receiving a first mode enable signal controlling a plurality of first switches such that the pull-down voltage on the voltage pull-down node is 0 volts in the single trimming mode and a negative voltage amount in the dual trimming mode; and
a second leg receiving a second mode enable signal controlling a plurality of second switches such that the pull-up voltage on the voltage pull-up node is 0 volts in the single trimming mode and a positive voltage amount in the dual trimming mode.

5. The voltage generator of claim 3, wherein the first digital-to-analog converter and the second digital-to-analog converter comprise 3-bit digital-to-analog converters.

6. The voltage generator of claim 1, further comprising an output voltage shift circuit operably connected to the first voltage generation circuit and the second voltage generation circuit,
wherein the output voltage shift circuit shifts a first voltage range of the first voltage generation circuit depending upon whether the first voltage generation circuit is operating in the single trimming mode or the dual trimming mode and further shifts a second voltage range of the second voltage generation circuit depending upon whether the second voltage generation circuit is operating in the single trimming mode or the dual trimming mode,
wherein the first output voltage is within the first voltage range,
wherein, when the first voltage generation circuit is operating in the single trimming mode, the first voltage range is from 0 volts to +1.8 volts,
wherein, when the first voltage generation circuit is operating in the dual trimming mode, the first voltage range shifts downward by 0.4 volts to −0.4 volts to +1.4 volts,
wherein the second output voltage is within the second voltage range,
wherein, when the second voltage generation circuit is operating in the single trimming mode, the second voltage range is from −1.8 volts to 0 volts, and
wherein, when the second voltage generation circuit is operating in the dual trimming mode, the second voltage range shifts upward by 0.4 volts to −1.4 volts to +0.4 volts.

7. An integrated circuit chip comprising:
a semiconductor substrate;
wells in the semiconductor substrate, the wells comprising at least a P-well and an N-well;
a circuit block comprising field effect transistors above the wells, the field effect transistors comprising at least a P-type field effect transistor and an N-type field effect transistor; and
a voltage generator comprising:
a first voltage generation circuit outputting a first output voltage at a first output voltage node electrically connected to the N-well; and
a second voltage generation circuit outputting a second output voltage at a second output voltage node electrically connected to the P-well,
wherein the first voltage generation circuit and the second voltage generation circuit are each selectively and individually operable in either a single trimming mode or a dual trimming mode.

8. The integrated circuit chip of claim 7, further comprising an output voltage shift circuit operably connected to the first voltage generation circuit and the second voltage generation circuit,
wherein the output voltage shift circuit shifts a first voltage range of the first voltage generation circuit depending upon whether the first voltage generation circuit is operating in the single trimming mode or the dual trimming mode and further shifts a second voltage range of the second voltage generation circuit depending upon whether the second voltage generation circuit is operating in the single trimming mode or the dual trimming mode,
wherein the first output voltage is within the first voltage range,
wherein, when the first voltage generation circuit is operating in the single trimming mode, the first voltage range is from 0 volts to a predetermined positive voltage,
wherein, when the first voltage generation circuit is operating in the dual trimming mode, the first voltage range shifts downward by a predetermined negative voltage shift amount,
wherein the second output voltage is within the second voltage range,
wherein, when the second voltage generation circuit is operating in the single trimming mode, the second voltage range is from a predetermined negative voltage to 0 volts, and
wherein, when the second voltage generation circuit is operating in the dual trimming mode, the second voltage range shifts upward by a predetermined positive voltage shift amount.

9. The integrated circuit chip of claim 8,
wherein the field effect transistors comprise any of regular threshold voltage field effect transistors and high threshold voltage field effect transistors, and
wherein the P-type field effect transistor is above the N-well and the N-type field effect transistor is above the P-well.

10. The integrated circuit chip of claim 8,
wherein the field effect transistors comprise any of super low threshold voltage field effect transistors and low threshold voltage field effect transistors, and
wherein the N-type field effect transistor is above the N-well and the P-type field effect transistor is above the P-well.

11. The integrated circuit chip of claim 8,
wherein the output voltage shift circuit comprising a voltage pull-down node and a voltage pull-up node,
wherein the first voltage generation circuit comprises: a first digital-to-analog converter operably connected to a first positive voltage rail, a second positive voltage rail and to the voltage pull-down node; and a first operational amplifier connected between the first digital-to-analog converter and the first output voltage node, the first digital-to-analog converter receiving a first digital code and outputting a corresponding first voltage signal to the first operational amplifier, wherein a magnitude of the first voltage signal depends upon the first digital code and a pull-down voltage at the voltage pull-down node and wherein a magnitude of the pull-down voltage depends upon whether the first voltage generation circuit is operating in the single trimming mode or the dual trimming mode, and wherein the second voltage generation circuit comprises: a second digital-to-analog converter operably connected to the second positive voltage rail, to the voltage pull-up node and to a negative voltage rail; a negative charge pump connected to the negative voltage rail; and a second operational amplifier connected between the second digital-to-analog converter and the second output voltage node, the second digital-to-analog converter receiving a second digital code and outputting a corresponding second voltage signal to the second operational amplifier, wherein a magnitude of the second voltage signal depends upon the second digital code and a pull-up voltage at the voltage pull-up node and wherein a magnitude of the pull-up voltage depends upon whether the second voltage generation circuit is operating in the single trimming mode or the dual trimming mode.

12. The integrated circuit chip of claim 11, wherein the output voltage shift circuit further comprises:
a first leg receiving a first mode enable signal controlling a plurality of first switches such that the pull-down voltage on the voltage pull-down node is 0 volts in the single trimming mode and a negative voltage amount in the dual trimming mode; and
a second leg receiving a second mode enable signal controlling a plurality of second switches such that the pull-up voltage on the voltage pull-up node is 0 volts in the single trimming mode and a positive voltage amount in the dual trimming mode.

13. The integrated circuit chip of claim 11, wherein the first digital-to-analog converter and the second digital-to-analog converter comprise 3-bit digital-to-analog converters.

14. The integrated circuit chip of claim 7, further comprising an output voltage shift circuit operably connected to the first voltage generation circuit and the second voltage generation circuit,
wherein the output voltage shift circuit shifts a first voltage range of the first voltage generation circuit depending upon whether the first voltage generation circuit is operating in the single trimming mode or the dual trimming mode and further shifts a second voltage range of the second voltage generation circuit depending upon whether the second voltage generation circuit is operating in the single trimming mode or the dual trimming mode,
wherein the first output voltage is within the first voltage range,
wherein, when the first voltage generation circuit is operating in the single trimming mode, the first voltage range is from 0 volts to +1.8 volts,
wherein, when the first voltage generation circuit is operating in the dual trimming mode, the first voltage range shifts downward by 0.4 volts to −0.4 volts to +1.4 volts,
wherein the second output voltage is within the second voltage range,
wherein, when the second voltage generation circuit is operating in the single trimming mode, the second voltage range is from −1.8 volts to 0 volts, and
wherein, when the second voltage generation circuit is operating in the dual trimming mode, the second voltage range shifts upward by 0.4 volts to −1.4 volts to +0.4 volts.

15. An integrated circuit chip comprising:
a semiconductor substrate;
wells with different type conductivities in the semiconductor substrate;
a first circuit block on the semiconductor substrate and comprising at least an N-type field effect transistor above a P-well in the semiconductor substrate and a P-type field effect transistor above an N-well in the semiconductor substrate; and
a second circuit block on the semiconductor substrate and comprising an N-type field effect transistor above an N-well in the semiconductor substrate and a P-type field effect transistor above a P-well in the semiconductor substrate; and
multiple voltage generators on the semiconductor substrate, each voltage generator comprising:
a first voltage generation circuit outputting a first output voltage at a first output voltage node; and
a second voltage generation circuit outputting a second output voltage at a second output voltage node,
wherein the first voltage generation circuit and the second voltage generation circuit are each selectively and individually operable in either a single trimming mode or a dual trimming mode,
wherein the multiple voltage generators comprise a first voltage generator operably connected to the first circuit block such that the first output voltage node of the first voltage generation circuit of the first voltage generator is electrically connected to the N-well below the P-type field effect transistor of the first circuit block and the second output voltage node of the second voltage generation circuit of the first voltage generator is electrically connected to the P-well below the N-type field effect transistor of the first circuit block, and
wherein the multiple voltage generators further comprise a second voltage generator operably connected to the second circuit block such that the first output voltage node of the first voltage generation circuit of the second voltage generator is electrically connected to the N-well below the N-type field effect transistor of the second circuit block and the second output voltage node of the second voltage generation circuit of the second voltage generator is electrically connected to the P-well below the P-type field effect transistor of the second circuit block.

16. The integrated circuit chip of claim 15,
wherein each voltage generator further comprises an output voltage shift circuit operably connected to the first voltage generation circuit and the second voltage generation circuit,
wherein the output voltage shift circuit shifts a first voltage range of the first voltage generation circuit depending upon whether the first voltage generation circuit is operating in the single trimming mode or the dual trimming mode and further shifts a second voltage range of the second voltage generation circuit depending upon whether the second voltage generation circuit is operating in the single trimming mode or the dual trimming mode,
wherein the first output voltage is within the first voltage range, wherein, when the first voltage generation circuit is operating in the single trimming mode, the first voltage range is from 0 volts to a predetermined positive voltage, wherein, when the first voltage generation circuit is operating in the dual trimming mode, the first voltage range shifts downward by a predetermined negative voltage shift amount, wherein the second output voltage is within the second voltage range, wherein, when the second voltage generation circuit is operating in the single trimming mode, the second voltage range is from a predetermined negative voltage to 0 volts, and wherein, when the second voltage generation circuit is operating in the dual trimming mode, the second voltage range shifts upward by a predetermined positive voltage shift amount.

17. The integrated circuit chip of claim 16, wherein the N-type field effect transistor and the P-type field effect transistor of the first circuit block comprise any of regular threshold voltage field effect transistors and high threshold voltage field effect transistors, and wherein the N-type field effect transistor and the P-type field effect transistor of the second circuit block comprise any of super low threshold voltage field effect transistors and low threshold voltage field effect transistors.

18. The integrated circuit chip of claim 16, wherein the output voltage shift circuit comprises a voltage pull-down node and a voltage pull-up node, wherein the first voltage generation circuit comprises: a first digital-to-analog converter operably connected to a first positive voltage rail, a second positive voltage rail and to the voltage pull-down node; and a first operational amplifier connected between the first digital-to-analog converter and the first output voltage node, the first digital-to-analog converter receiving a first digital code and outputting a corresponding first voltage signal to the first operational amplifier, wherein a magnitude of the first voltage signal depends upon the first digital code and a pull-down voltage at the voltage pull-down node and wherein a magnitude of the pull-down voltage depends upon whether the first voltage generation circuit is operating in the single trimming mode or the dual trimming mode, and wherein the second voltage generation circuit comprises: a second digital-to-analog converter operably connected to the second positive voltage rail, to the voltage pull-up node and to a negative voltage rail; a negative charge pump connected to the negative voltage rail; and a second operational amplifier connected between the second digital-to-analog converter and the second output voltage node, the second digital-to-analog converter receiving a second digital code and outputting a corresponding second voltage signal to the second operational amplifier, wherein a magnitude of the second voltage signal depends upon the second digital code and a pull-up voltage at the voltage pull-up node and wherein a magnitude of the pull-up voltage depends upon whether the second voltage generation circuit is operating in the single trimming mode or the dual trimming mode.

19. The integrated circuit chip of claim 18, wherein the output voltage shift circuit further comprises:
   a first leg receiving a first mode enable signal controlling a plurality of first switches such that the pull-down voltage on the voltage pull-down node is 0 volts in the single trimming mode and a negative voltage amount in the dual trimming mode; and
   a second leg receiving a second mode enable signal controlling a plurality of second switches such that the pull-up voltage on the voltage pull-up node is 0 volts in the single trimming mode and a positive voltage amount in the dual trimming mode.

20. The integrated circuit chip of claim 18, wherein the first digital-to-analog converter and the second digital-to-analog converter comprise 3-bit digital-to-analog converters.

* * * * *